(12) United States Patent
Yoon et al.

(10) Patent No.: US 7,986,076 B2
(45) Date of Patent: Jul. 26, 2011

(54) ENERGY HARVESTING DEVICE

(75) Inventors: Sang Won Yoon, Ann Arbor, MI (US); Alexandros Margomenos, Pasadena, CA (US)

(73) Assignee: Toyota Motor Engineering & Manufacturing North America, Inc,, Erlanger, KY (US)

( * ) Notice: Subject to any disclaimer, the term of this patent is extended or adjusted under 35 U.S.C. 154(b) by 0 days.

(21) Appl. No.: 12/610,771

(22) Filed: Nov. 2, 2009

(65) Prior Publication Data
US 2011/0101827 A1  May 5, 2011

(51) Int. Cl.
*H01L 41/08* (2006.01)
(52) U.S. Cl. .......................................... 310/329; 310/339
(58) Field of Classification Search .................. 310/328, 310/329, 339
See application file for complete search history.

(56) References Cited

U.S. PATENT DOCUMENTS

| | | |
|---|---|---|
| 6,407,484 B1 | 6/2002 | Oliver et al. |
| 6,411,016 B1 * | 6/2002 | Umeda et al. ................. 310/339 |
| 6,858,970 B2 | 2/2005 | Malkin et al. |
| 6,954,025 B2 | 10/2005 | Nishida et al. |
| 7,471,033 B2 | 12/2008 | Thiesen et al. |
| 7,579,757 B2 * | 8/2009 | Kulah et al. ................... 310/339 |
| 7,821,183 B2 * | 10/2010 | Rastegar ....................... 310/339 |
| 2003/0197448 A1 | 10/2003 | Tanielian |
| 2004/0075363 A1 | 4/2004 | Malkin et al. |
| 2005/0134148 A1 | 6/2005 | Buhler et al. |
| 2005/0134149 A1 | 6/2005 | Deng et al. |
| 2005/0253486 A1 | 11/2005 | Schmidt |
| 2006/0017353 A1 * | 1/2006 | Sakai ............................ 310/339 |
| 2006/0087200 A1 * | 4/2006 | Sakai ............................ 310/339 |
| 2007/0205881 A1 | 9/2007 | Breed |
| 2007/0295069 A1 | 12/2007 | Mancosu et al. |
| 2008/0074002 A1 | 3/2008 | Priya et al. |
| 2008/0100180 A1 | 5/2008 | Clingman et al. |
| 2008/0100182 A1 | 5/2008 | Chang et al. |
| 2008/0129147 A1 | 6/2008 | Thiesen et al. |
| 2008/0129153 A1 | 6/2008 | Roundy et al. |
| 2008/0136562 A1 | 6/2008 | Kulah et al. |
| 2008/0174273 A1 | 7/2008 | Priya et al. |
| 2009/0015103 A1 | 1/2009 | Rastegar et al. |

(Continued)

FOREIGN PATENT DOCUMENTS

JP       2009-077595 A       4/2009

(Continued)

OTHER PUBLICATIONS

Marco Ferrari et al.; Piezoelectric Multifrequency Energy Converter for Power Harvesting in Autonomous Microsystems; ScienceDirect; (2008) pp. 329-335.

(Continued)

*Primary Examiner* — Mark Budd
(74) *Attorney, Agent, or Firm* — Gifford, Krass, Sprinkle, Anderson & Citkowski, P.C.

(57) ABSTRACT

The present invention discloses an energy harvesting device that converts small magnitude and low frequency vibrations into electrical energy. The device can include a base, a low frequency element, and a piezoelectric element. The low frequency element can be movably attached to the base and the piezoelectric element can also be attached to the base and be spaced apart from the low frequency element with a vacant space therebetween. Upon vibration of the low frequency element resulting from environmental vibrations, the low frequency element can impact the piezoelectric element and cause elastic deformation thereto.

20 Claims, 7 Drawing Sheets

U.S. PATENT DOCUMENTS

2009/0115293 A1     5/2009    Wang et al.
2009/0167110 A1     7/2009    Berkcan et al.
2009/0322184 A1*   12/2009   Carman et al. ................ 310/339

FOREIGN PATENT DOCUMENTS

JP           2010-136542 A     6/2010

OTHER PUBLICATIONS

Vinod R. Challa et al.; A Vibration Energy Harvesting Device With Bidirectional Resonance Frequency Tunability; Smart Materials and Structures 17; (2008) 015035; pp. 1-10.

F. Lu et al; Modeling and Analysis of Micro Piezoelectric Power Generators for Micro-Electromechanical-Systems Applications; Smart Materials and Structures 13; (2004); pp. 57-63.

Bin Yang et al.; Electromagnetic Energy Harvesting From Vibrations of Multiple Frequencies; J. Micromech. Microeng. 19; (2009) 035001; pp. 1-8.

Xiaochun Wu et al.; Modeling, Design and Optimization of Hybrid Electromagnetic and Piezoelectric MEMS Energy Scavengers; IEEE 2008 Custom Integrated Circuits Conference (CICC); pp. 177-180.

Shadrach Joseph Roundy; Energy Scavenging for Wireless Sensor Nodes With a Focus on Vibration to Electrictiy Conversion; (2003).

M. Edamoto et al.; Low-Resonant-Frequency Micro Electret Generator for Energy Harvesting Application; (2009) pp. 1059-1062.

* cited by examiner

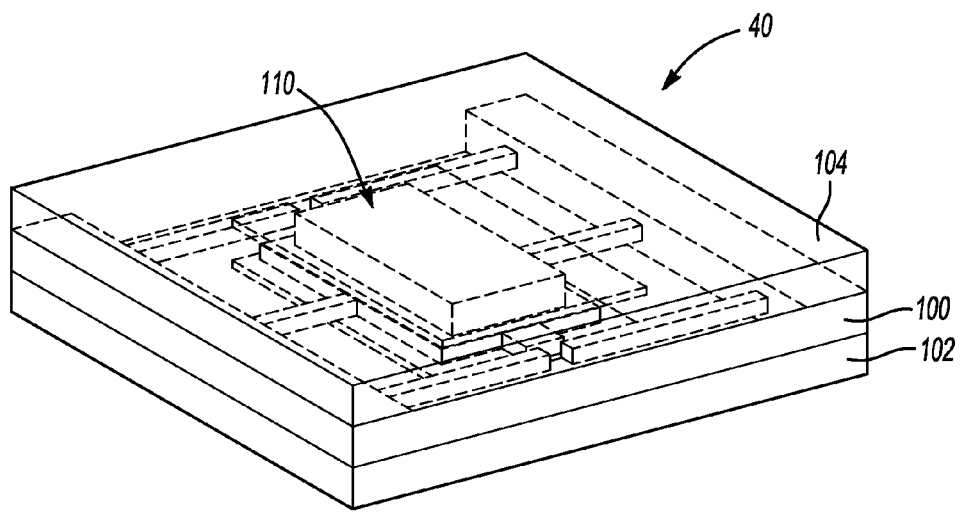
_Fig-17_
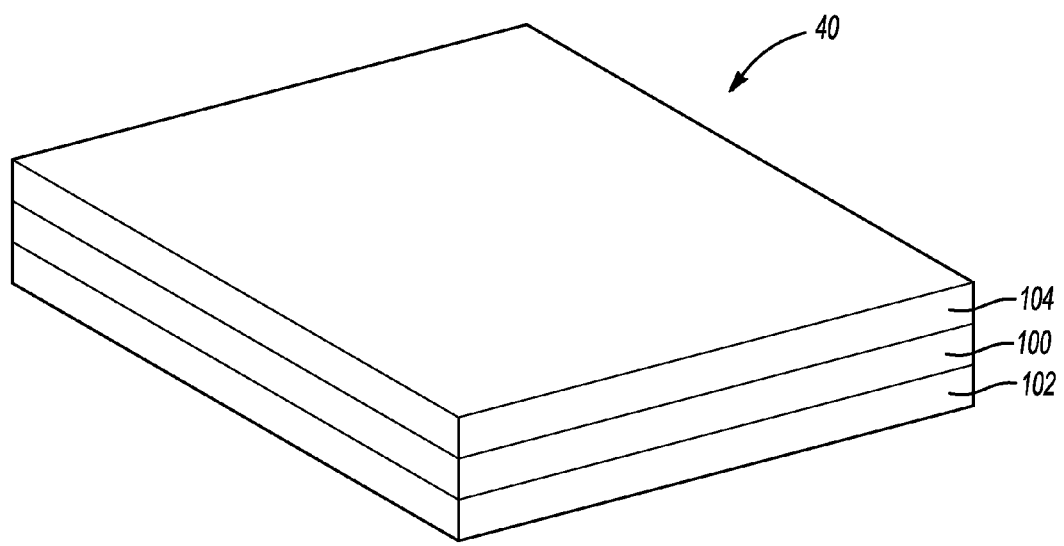
_Fig-18_

ENERGY HARVESTING DEVICE

FIELD OF THE INVENTION

The present invention relates to an energy harvesting device and, in particular, an energy harvesting device that can convert environmental vibrations to electrical energy.

BACKGROUND OF THE INVENTION

The conversion or scavenging of environmental vibration to voltage differential can provide free and clean energy. In addition, environmental vibration is present in a multitude of operations, activities, and the like, and such vibrations are not significantly influenced by environmental conditions such as temperature, humidity, amount of sunlight, etc. As such, environmental vibration is one of the most attractive power sources that can provide consistent power for extended periods of time.

Vibration scavenging, also known as energy scavenging or energy harvesting, converts vibration to electrical energy using a piezoelectric material, the piezoelectric material converting mechanical strain into a voltage differential by creating a charge separation across a dielectric material. In particular, a piezoelectric energy harvesting device affords for bending of a piezoelectric strip or plank that is secured at one end and movable at an opposing end. The bending of the piezoelectric material results in elastic deformation thereof, the elastic deformation being transformed or converted into electrical energy.

Energy generated by such a piezoelectric energy harvesting device is proportional to the average mechanical strain, i.e. elastic deformation, that the material experiences during bending. In addition, piezoelectric materials are typically stiff in nature and thus more effective and useful for relatively high-frequency applications. However, environmental vibration is typically low frequency. As such, heretofor piezoelectric energy harvesting devices have had limited success in part due to environmental vibration typically being of small magnitude and low frequency and/or the expense of providing a plurality of devices that can harvest an appreciable amount of energy. Therefore, an energy harvesting device that can take advantage of small magnitude and low frequency vibrations that are present in many operations, activities, and the like using piezoelectric materials and is affordable to fabricate would be desirable.

SUMMARY OF THE INVENTION

The present invention discloses an energy harvesting device that converts small magnitude and low frequency (hereafter referred to as small magnitude/low frequency) vibrations into electrical energy. The device can include a base, a low frequency element and a piezoelectric element. The low frequency element can be movably attached to the base and have a two-dimensional vibrational movement. The piezoelectric element can be attached to the base and be spaced apart from the low frequency element with a vacant space therebetween. Upon movement of the low frequency element resulting from environmental vibration, the low frequency element can impact the piezoelectric element and cause elastic deformation thereto. The elastic deformation of the piezoelectric element can then generate a voltage differential which can be used to provide electrical energy.

In some instances, the base is a frame that surrounds the low frequency element, and the base and/or low frequency element can be made from silicon. In addition, the low frequency element can be integral with the base. An optional mass can be rigidly attached to the low frequency element and the optional mass can be made from a metallic material such as tungsten, rhenium, gold, lead, and alloys thereof.

In one embodiment, the piezoelectric element is a piezoelectric strip that is rigidly attached to the frame, the movement of the low frequency element bringing it into contact with the piezoelectric strip and causing elastic deformation to a piezoelectric material. As stated above, the elastic deformation affords a voltage differential across the piezoelectric strip that can be gathered, stored, used, etc., as electrical energy. In some instances, the device can include a pair of piezoelectric strips that are rigidly attached to the frame, with a first piezoelectric strip rigidly attached to the frame on one side of the low frequency element and a second piezoelectric strip rigidly attached to the frame on an opposite side of the low frequency element.

In another embodiment, the piezoelectric element is a high frequency beam with a first end attached to the base, a second end that is spaced apart from the first end and is not attached to the base, thereby being free to move and/or vibrate. The high frequency beam has a resonant frequency and vibrates at this frequency after it has been impacted by the low frequency element. In some instances, the high frequency beam has a first end and a second end that are attached to the base, the beam still having a resonant frequency and vibrating at this frequency after being impacted by the low frequency element.

The high frequency beam can have a beam element and a piezoelectric strip, the piezoelectric strip rigidly attached to the beam element such that when the high frequency beam vibrates, the piezoelectric strip experiences a bending movement that results in elastic deformation thereof. It is appreciated that the piezoelectric strip can be rigidly attached to the beam element proximate to an end of the beam that is attached to the frame. In addition, the high frequency beam can have two piezoelectric strips, with a first piezoelectric strip rigidly attached to a first side of the beam element and a second piezoelectric strip rigidly attached to an oppositely disposed second side of the beam element. In some instances, the device can have a pair of spaced apart high frequency beams with a first high frequency beam located on one side of the low frequency element and a second high frequency beam located on an opposing side of the low frequency element.

In yet another embodiment, the low frequency element can have a three-dimensional vibrational movement and the piezoelectric element can have an in-plane element and an out-of-plane element. The in-plane element of the piezoelectric element can include a piezoelectric strip that is rigidly attached to the frame, a high frequency beam that is attached to the base or frame, and/or combinations thereof. The out-of-plane element can be a piezoelectric film and/or strip that is located out-of-plane from the low frequency element and positioned such that it can be impacted by the low frequency element when it moves out-of-plane from its two-dimensional movement. It is appreciated that the piezoelectric film and/or strip can also have a resonant frequency at which it vibrates upon being impacted by the low frequency element.

The energy harvesting device can also have a surrounding package that encloses the low frequency element and the piezoelectric element. The surrounding package may or may not be made from silicon and can prevent contamination of the energy harvesting device from dirt, dust, water, debris, and the like.

BRIEF DESCRIPTION OF THE DRAWINGS

FIG. 17 is a perspective view of a surrounding package enclosing the embodiment shown in FIG. 1;

FIG. 18 is a perspective view of a surrounding package; and

DETAILED DESCRIPTION OF THE INVENTION

Figure 1:
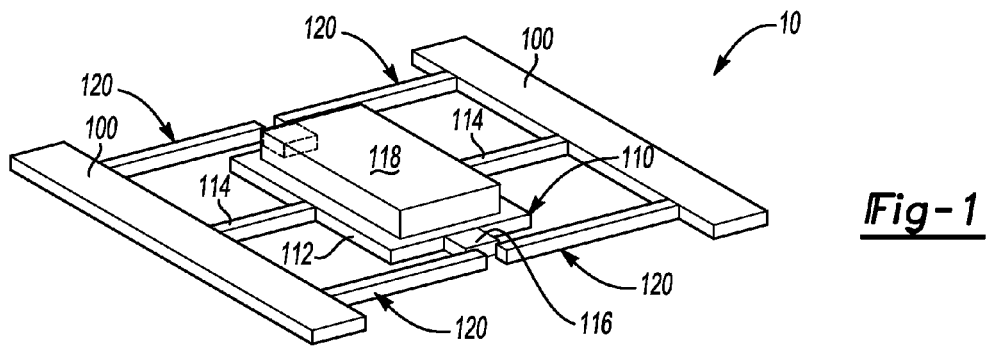
FIG. 1 is a perspective view of an energy harvesting device according to an embodiment of the present invention.

The present invention discloses an energy harvesting device that can convert small magnitude/low frequency vibrations into electrical energy. As such, the present invention has utility as a component for the generation of electrical energy.

The energy harvesting device converts mechanical vibration into electrical energy by subjecting a piezoelectric element to elastic deformation, the elastic deformation affording a voltage differential across a dielectric material. A low frequency element is included and can be designed, shaped, etc. such that it maximizes its movement in response to small magnitude/low frequency vibrations that are present in a particular operation, activity and the like. For example and for illustrative purposes only, such small magnitude/low frequency vibrations can be present in the operation of motor vehicles, aircraft, heavy equipment machinery, office equipment, construction equipment, and the like. As such, the energy harvesting devices taught herein can be part of a power source for wireless sensor modules used in diverse applications where frequent exchange and/or replacement of batteries is not desired. For example and for illustrative purposes only, such situations can include monitoring of building/structure integrity, earthquake sensors, weather sensors, ocean condition sensors, automotive sensors, human activity sensors, human organ activity or health sensors, and the like.

The energy harvesting device can include a base that may or may not be rigidly attached to a parent component such as a motor vehicle, heavy equipment machinery, office equipment and the like. A low frequency element can also be included, the low frequency element being attached to the base. Upon vibration of the parent component, the base can move therewith and the low frequency element can move and/or vibrate relative to the base. In some instances, the low frequency element has a one-dimensional vibrational movement. In other instances, the low frequency element has a two-dimensional vibrational movement.

In addition to the low frequency element, the energy harvesting device also can have a piezoelectric element that is attached to the base and spaced apart from the low frequency element with a vacant space therebetween. Upon vibration of the low frequency element, the piezoelectric element is spaced apart, positioned and/or located relative to the low frequency element such that it is impacted by the low frequency element and a piezoelectric material experiences elastic deformation. The elastic deformation of the piezoelectric element results in the generation of a voltage differential, thereby creating electrical energy that can be conducted away from the piezoelectric element through the use of electrical conducting leads that are in electrical contact therewith and extending therefrom.

In some instances, the piezoelectric element can have a resonant frequency and impact of the piezoelectric element by the low frequency element can afford for the piezoelectric element to vibrate at the resonant frequency. It is appreciated that the vibration of the piezoelectric element can also result in the elastic deformation of a piezoelectric material and thus additional energy can be generated therefrom.

The base can be a frame that surrounds the low frequency element. In addition, the base and the low frequency element can be made from silicon, where the term "silicon" is defined to include commercial pure silicon and silicon alloys. The low frequency element can be integral with the base and may or may not include an optional mass that is rigidly attached thereto. The optional mass can be made from a metallic material such as tungsten, rhenium, gold, lead, alloys thereof, and the like. It is appreciated that the low frequency element with or without the optional mass can be designed such that its vibration is maximized with respect to a range, or group of ranges, of small magnitude/low frequency vibrations experienced by a particular parent component such as a particular motor vehicle, a particular piece of heavy equipment machinery and the like.

The piezoelectric element can be a piezoelectric strip that is rigidly attached to the frame. In some instances, the piezoelectric element can be a pair of piezoelectric strips rigidly attached to the frame, with a first piezoelectric strip rigidly attached to the frame on one side of the low frequency element and a second piezoelectric strip rigidly attached to the frame on an opposite side of the low frequency element. The piezoelectric element can also be a high frequency beam that is attached to the base and has a resonant frequency at which it vibrates when impacted by the low frequency element. The high frequency beam can have a first end attached to the base with a second non-attached end spaced apart from the first end, or in the alternative, a first end and a second end attached to the base, the second end spaced apart from the first end.

The high frequency beam can have a beam element and a piezoelectric strip, the piezoelectric strip rigidly attached to the beam element. In some instances, the piezoelectric strip is rigidly attached to the beam element proximate the first end and/or the second end thereof. In addition, the high frequency beam can have two piezoelectric strips, with a first piezoelectric strip rigidly attached to a first side of the beam element and a second piezoelectric strip rigidly attached to an oppositely disposed second side of the beam element. Similar to piezoelectric strips that are rigidly attached to the frame, a pair of spaced apart high frequency beams can be provided with a first high frequency beam located on one side of the low frequency element and a second high frequency beam located on an opposite side of the low frequency element.

In the event that the low frequency element has three-dimensional vibrational movement, the piezoelectric element can have an in-plane element and an out-of-plane element. The in-plane element can include the piezoelectric element described above such that a piezoelectric strip and/or a high frequency beam is attached to the frame. The out-of-plane element can include a piezoelectric strip and/or a piezoelectric film that is located out-of-plane relative to the two-dimensional movement of the low frequency element. For example and for illustrative purposes only, a piezoelectric strip and/or a piezoelectric film can be located above, below, to the left, to the right, etc., of the low frequency element that is attached to the frame.

The energy harvesting device can include a surrounding package that encloses the low frequency element and the piezoelectric element. In some instances, the surrounding package can be made from silicon and ensures that the area and/or volume surrounding the low frequency element and the piezoelectric element are free from contamination such as dirt, dust, debris, water vapor, and the like. In addition, the energy harvesting device with or without the surrounding package can be self-packaged on a wafer, such as a silicon wafer. As such, the fabrication of the energy harvesting device lends itself to batch processing with conventional microfabrication techniques that enables mass production and cost reduction. For example and for illustrative purposes only, the structure of the frame, low frequency element and piezoelectric element can be integrally formed from a silicon wafer using plasma etching, chemical etching, milling, ion milling, chemical milling and the like. In addition, a plurality of energy harvesting devices can be made from a single silicon wafer with the surrounding package made from one or more adjacent silicon wafers. In the alternative, other fabrication processes can be used to fabricate the energy harvesting device, illustratively including molding, injection molding, machining, etc.

Turning now to FIG. 1, an embodiment of an energy harvesting device is shown generally at reference numeral 10. The device 10 can include a base 100 with a low frequency element 110 and a piezoelectric element 120 attached thereto. The low frequency element 110 can have a base plate 112 and a leg 114. The leg 114 attaches the base plate 112 to the base 100. An optional mass 118 can be rigidly attached to the base plate 112 and be used to tune the resonant frequency of the low frequency element 110. In addition, a bumper 116 can extend from the base plate 112 and in some instances extends in a generally normal direction relative to a length direction of the leg 114.

As shown in FIG. 1, the low frequency element 110 can have a pair of legs 114 such that the element 110 has opposing sides that are attached to the base 100. It is appreciated that the one or more legs 114 afford for a generally sideways movement of the element 110 in a direction towards one or more high frequency beams 120. For the purposes of the present invention, the generally sideways movement of the low frequency element such that it contacts the piezoelectric element 120 is defined as "in-plane" and movement not in-plane is "out-of-plane" movement.

The base 100 and the low frequency element 110 can be integral with each other. For example and for illustrative purposes only, a silicon wafer can be etched, milled, etc., such that material is removed from the wafer and the base 100, low frequency element 110, and high frequency beam 120 remain.

Figure 2:
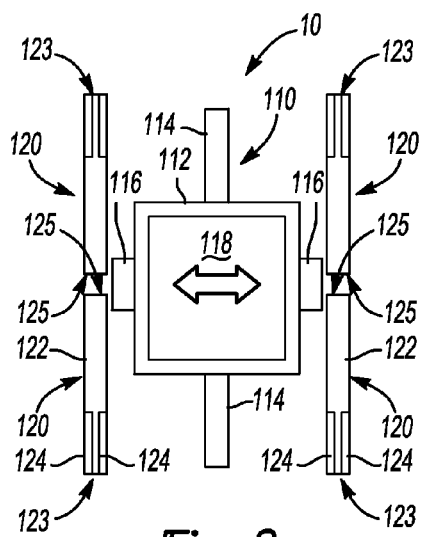
FIG. 2 is a schematic illustration of an embodiment for the energy harvesting device shown in FIG. 1.

Looking now to FIGS. 2-5, four embodiments are shown that represent possible configurations for a low frequency element and a high frequency beam. For example, FIG. 2 illustrates embodiment 10 with the low frequency element 110 spaced apart from four high frequency beams 120 with vacant space therebetween. As shown in this figure, the base plate 112 has a pair of legs 114 that extend therefrom and the base legs 114 can be attached to the base 100 as illustrated in FIG. 1 but not shown in FIGS. 2-5. Embodiment 10 has two pairs of high frequency beams 120, with one pair adjacent to one of the legs 114 and another pair adjacent to the other leg 114. In addition, each of the high frequency beams 120 can have a beam element 122 and a piezoelectric strip 124, the beam element 122 having a first end 123 and a second end 125. The first end 123 can be attached to the base 100 and the second end 125 can be free to move and/or vibrate.

Proximate to the first end 123 can be a piezoelectric strip 124 rigidly attached to the beam element 122. In some instances, there can be a pair of piezoelectric strips 124, with one piezoelectric strip 124 rigidly attached to one side of the beam element 122 and a second piezoelectric strip 124 attached to an opposite side of the beam element 122. In addition, one or more of the piezoelectric strips 124 can be rigidly attached to the beam element proximate to the first end 123 such that vibration of the piezoelectric element 120 maximizes the power generated from the one or more piezoelectric strips 124.

It is appreciated that with movement/vibration of the low frequency element 110, the bumpers 116 can contact the high frequency beams 120 and afford for their movement. The movement of the high frequency beams 120 can result in their vibration at a resonant frequency which provides a bending movement and elastic deformation of the piezoelectric strips 124. In turn, the elastic deformation is converted to a voltage differential which affords an electrical current that can flow the strips 124 to a separate desired location using conductive leads (not shown). It is appreciated that the conductive leads can be deposited onto the energy harvesting device using microfabrication techniques known to those skilled in the art.

Figure 3:
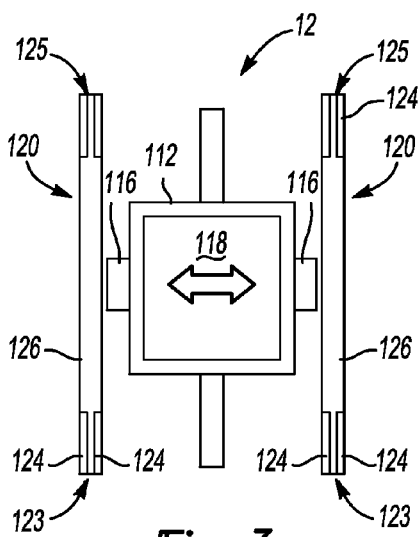
FIG. 3 is a schematic illustration of an embodiment for the energy harvesting device shown in FIG. 1.

An alternative embodiment 12 as shown in FIG. 3 can include a low frequency element 110 that is identical and/or similar to the embodiment shown in FIG. 2 with one or more high frequency beams 126. The high frequency beams 126 have a first end 123 and a second end 125 that are both attached to the base 100. Stated differently, the high frequency beam 126 does not have a free end as does the high frequency beam 122 shown in FIG. 2. Similar to the high frequency beam 122, a piezoelectric strip 124 can be rigidly attached to the beam 126 proximate to the first end 123. In addition, a piezoelectric strip 124 can be attached to the beam 126 proximate to the second end 125. It is appreciated that the low frequency element 110 can contact the high frequency beam 126 and afford for its vibration at a resonant frequency and bending movement of the piezoelectric strip 124. As shown in FIG. 3, a first high frequency beam 126 can be located on one side of the low frequency element 110 and a second high frequency beam 126 can be located on an opposite side of the element 110. The strip can also be located at only one side of the element 110.

Figure 4:
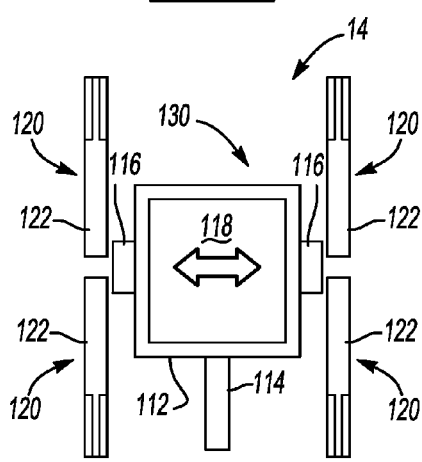
FIG. 4 is a schematic illustration of an embodiment for the energy harvesting device shown in FIG. 1.
Figure 5:
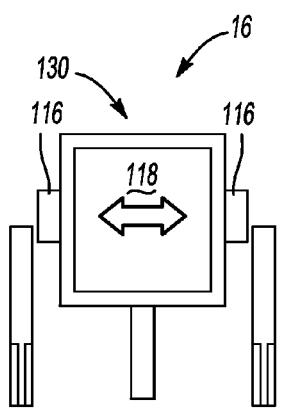
FIG. 5 is a schematic illustration of an embodiment for the energy harvesting device shown in FIG. 1.
Figure 6:
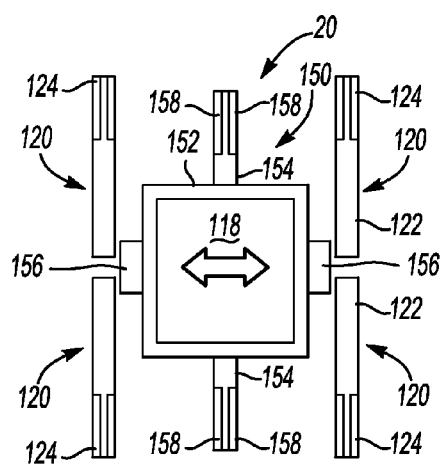
FIG. 6 is a schematic illustration of an embodiment for the energy harvesting device shown in FIG. 1.
Figure 7:
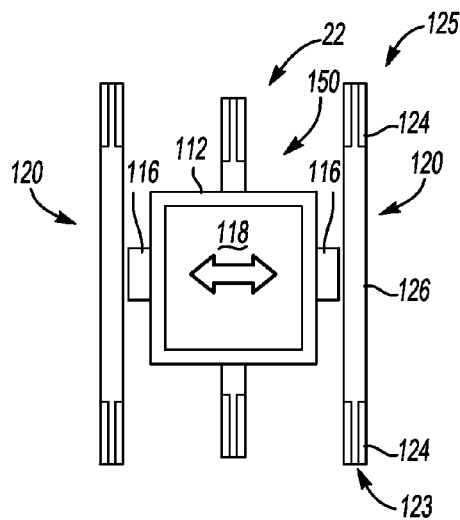
FIG. 7 is a schematic illustration of an embodiment for the energy harvesting device shown in FIG. 1.
Figure 8:
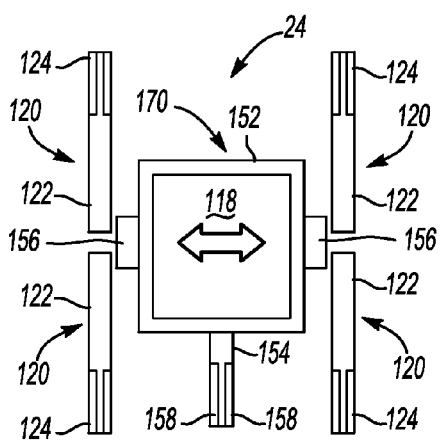
FIG. 8 is a schematic illustration of an embodiment for the energy harvesting device shown in FIG. 1.
Figure 9:
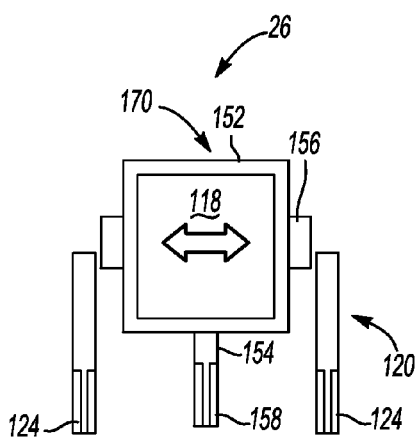
FIG. 9 is a schematic illustration of an embodiment for the energy harvesting device shown in FIG. 1.

Referring to FIGS. 4 and 5, embodiments 14 and 16 are shown where a low frequency element 130 is provided with a base plate 112 and only one leg 114. In this manner, the low frequency element 130 exhibits more of a cantilever movement rather than more of a linear movement as provided by the low frequency element 110. As shown in embodiment 14, two pairs of high frequency beams 122 can be provided, or in the alternative, only one pair of high frequency beams 122 can be provided as shown in FIG. 5. It is appreciated that the low frequency element 130 can also be used in combination with one or more of the high frequency beams 126 illustrated in FIG. 3. It is further appreciated that piezoelectric strips 124 are rigidly attached to the high frequency beams 126 as taught above for attachment of the strips 124 to the high frequency beams 122.

Looking now at FIGS. 6-9, embodiments 20-26 are similar to the embodiments shown in FIGS. 2-5 except for piezoelectric strips 158 being present on one or more legs 154 that attach a low frequency element 150 and/or 170 to the base 100. As shown in these figures, one or more of the piezoelectric strips 158 can be attached to the leg 154 proximate to a location where the leg 154 attaches to the base 100. In addition, a first piezoelectric strip 158 can be attached to one side of the leg 154 and a second piezoelectric strip 158 can be attached to an opposite side of the leg 154. Similar to the embodiments shown in FIGS. 2-5, high frequency beams 122 and/or 126 can be located adjacent to the low frequency element 150 and/or 170 such that the bumpers 116 can impact the beams during in-plane movement of the element 150 and/or 170. In addition, the high frequency beams 122 and/or 126 can vibrate at a resonant frequency and afford elastic deformation of the piezoelectric material 124. As such, a voltage differential and electrical current can be produced and gathered from such embodiments.

Figure 10:
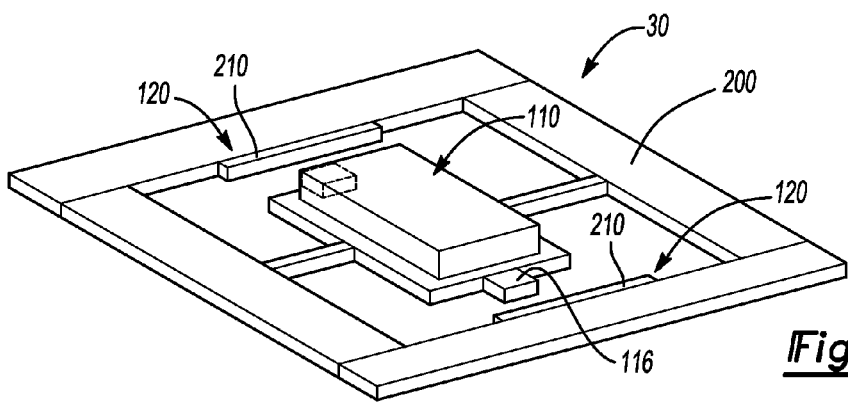
FIG. 10 is a perspective view of an energy harvesting device according to another embodiment of the present invention.
Figure 11:
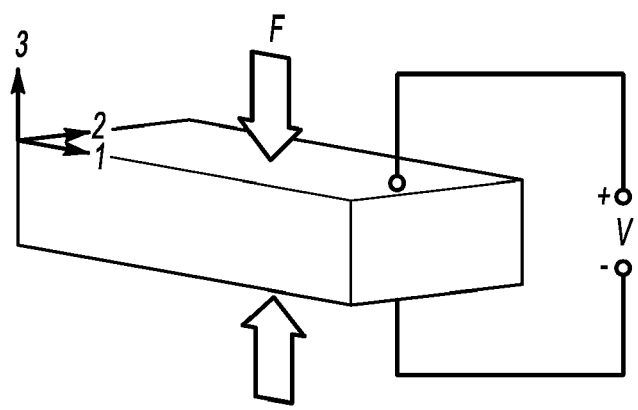
FIG. 11 is a schematic drawing illustrating 33-mode of elastic deformation for a piezoelectric material.
Figure 12:
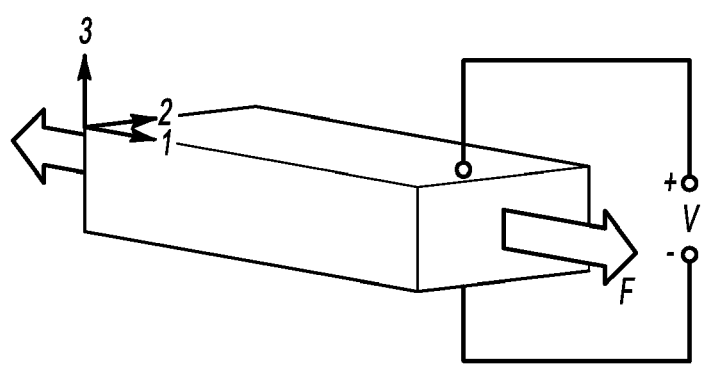
FIG. 12 is a schematic drawing illustrating 31-mode of elastic deformation for a piezoelectric material.

Turning now to FIG. 10, an embodiment 30 of an energy harvesting device is shown with a base 200, the low frequency element 110, and the piezoelectric element 120. However, in embodiment 40 the piezoelectric element 120 is in the form of a piezoelectric strip or film 210 that is rigidly attached to the base 200. As shown in the figure, the base 200 can be in the form of a frame that surrounds the low frequency element 110 and the piezoelectric element 120. It is appreciated that such a frame can also be included with embodiments 10-26 shown in FIGS. 1-9. For embodiment 30, impact of the piezoelectric strip 210 by the bumper 116 affords for elastic deformation of the piezoelectric material in the form of compression. Such elastic deformation can be 33-mode deformation of the piezoelectric material as illustrated in FIG. 11, whereas deformation of the piezoelectric material as illustrated in the embodiments shown in FIGS. 1-9 can be in the form of a 31-mode (FIG. 12). It is further appreciated that the exact design, shape, parameters, etc., of an energy harvesting device can be modified in order to maximize the resonant frequency and/or vibration of the low frequency element and/or piezoelectric element for use with a particular parent component, thereby maximizing the amount of electrical energy afforded by the vibration of the parent component.

Figure 13:
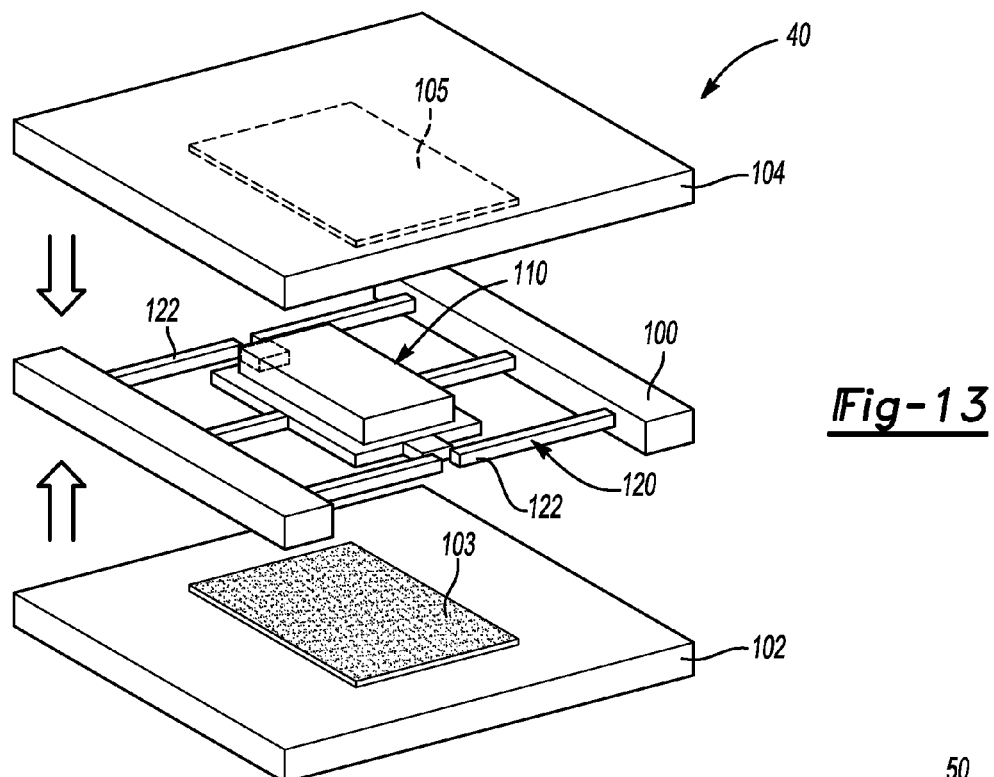
FIG. 13 is a perspective view of the embodiment shown in FIG. 1 illustrating a piezoelectric element that can accommodate two-dimensional vibrational movement of a low frequency element.
Figure 14:
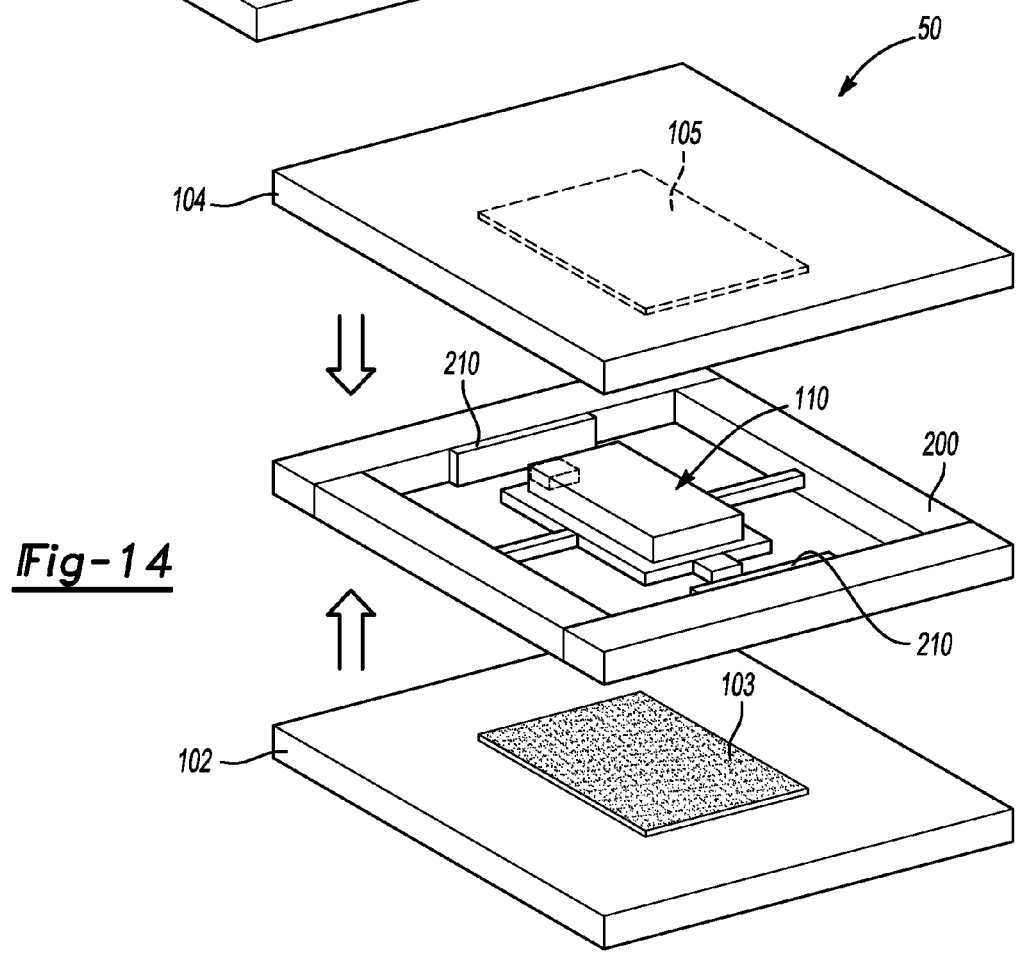
FIG. 14 is a perspective view of the embodiment shown in FIG. 10 illustrating a piezoelectric element that can accommodate two-dimensional vibrational movement of the low frequency element.

Turning now to FIGS. 13 and 14, embodiment 40 illustrates an energy harvesting device where movement of the low frequency element 110 can be out-of-plane and yet is taken advantage of with the use of a piezoelectric film 103 and/or 105 that are located out-of-plane relative to the low frequency element 110. In particular, FIGS. 13 and 14 illustrate the use of the piezoelectric film 103 and/or 105 in combination with a lower cover 102 and/or an upper cover 104, respectively, in a manner such that out-of-plane movement of the low frequency element 110 can impact the piezoelectric film(s), the impact causing elastic deformation thereof and thus generation of a voltage differential. In this manner, random vibration of a parent component that results in two-dimensional movement of the low frequency element can be taken advantage of.

Figure 15:
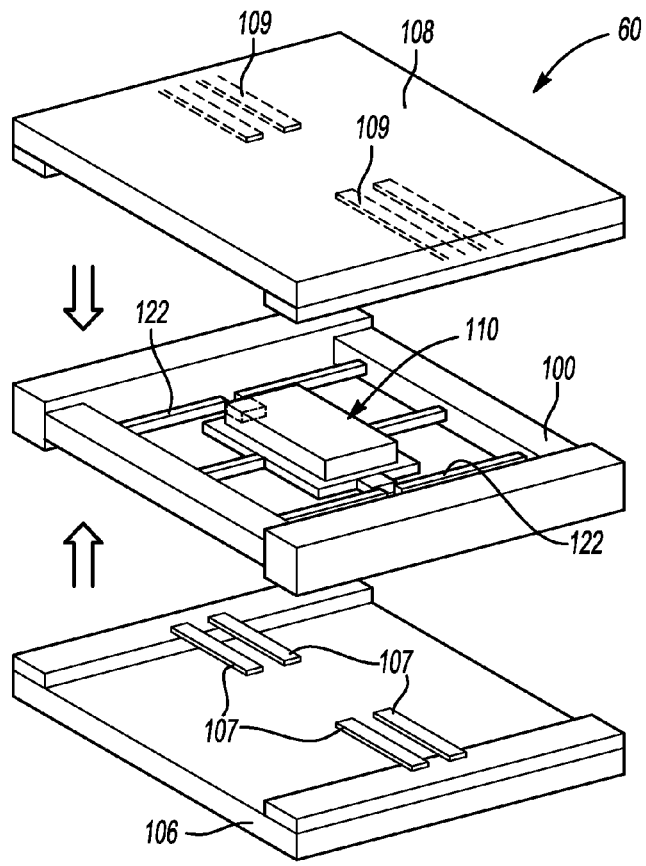
FIG. 15 is a perspective view of another embodiment that can accommodate two-dimensional vibrational movement of the low frequency element.
Figure 16:
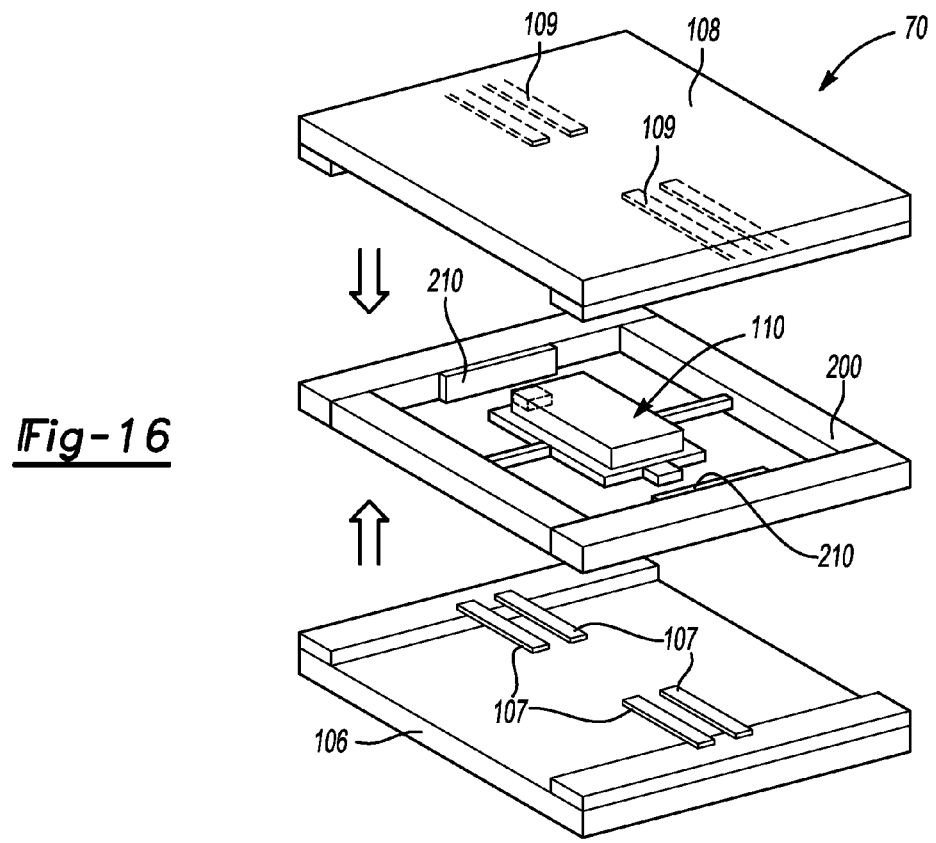
FIG. 16 is a perspective view of another embodiment that can accommodate two-dimensional vibrational movement of the low frequency element.

FIGS. 15 and 16 illustrate embodiments 60 and 70, respectively, where two-dimensional movement of the low frequency element 110 is taken advantage of with the use of piezoelectric strips 107. The piezoelectric strips 107 can be rigidly attached to a lower cover 106 and piezoelectric strips 109 can be rigidly attached to an upper cover 108. It is appreciated that the movement/vibration of the low frequency element 110 can impact the high frequency beam 122 and/or the piezoelectric strip 210 during its in-plane movement and the piezoelectric strip 107 and/or the piezoelectric strip 109 during its out-of-plane movement. It is further appreciated that the use of low frequency elements such as those illustrated in FIGS. 5-9 can be included with the embodiments shown in FIGS. 9-16 in order to take advantage of the characteristics of vibrational movement of a parent component, reduce cost of the fabrication of an energy harvesting device, and the like. It is yet even further appreciated that the piezoelectric strips 107 and/or 109 can have a different structure such as a high frequency beam 120 with one or more piezoelectric strips 124 as taught above in FIGS. 2-9.

FIGS. 17 and 18 illustrate embodiment 40 with the lower cover 102 and upper cover 104 attached to the base 100. As illustrated in this figure, a self-packaged energy harvesting device is provided. Again as stated above, the all of the embodiments 10-70 can have the base, frame, low frequency element, and piezoelectric element formed integral with each other with piezoelectric material attached thereto.

Figure 19:
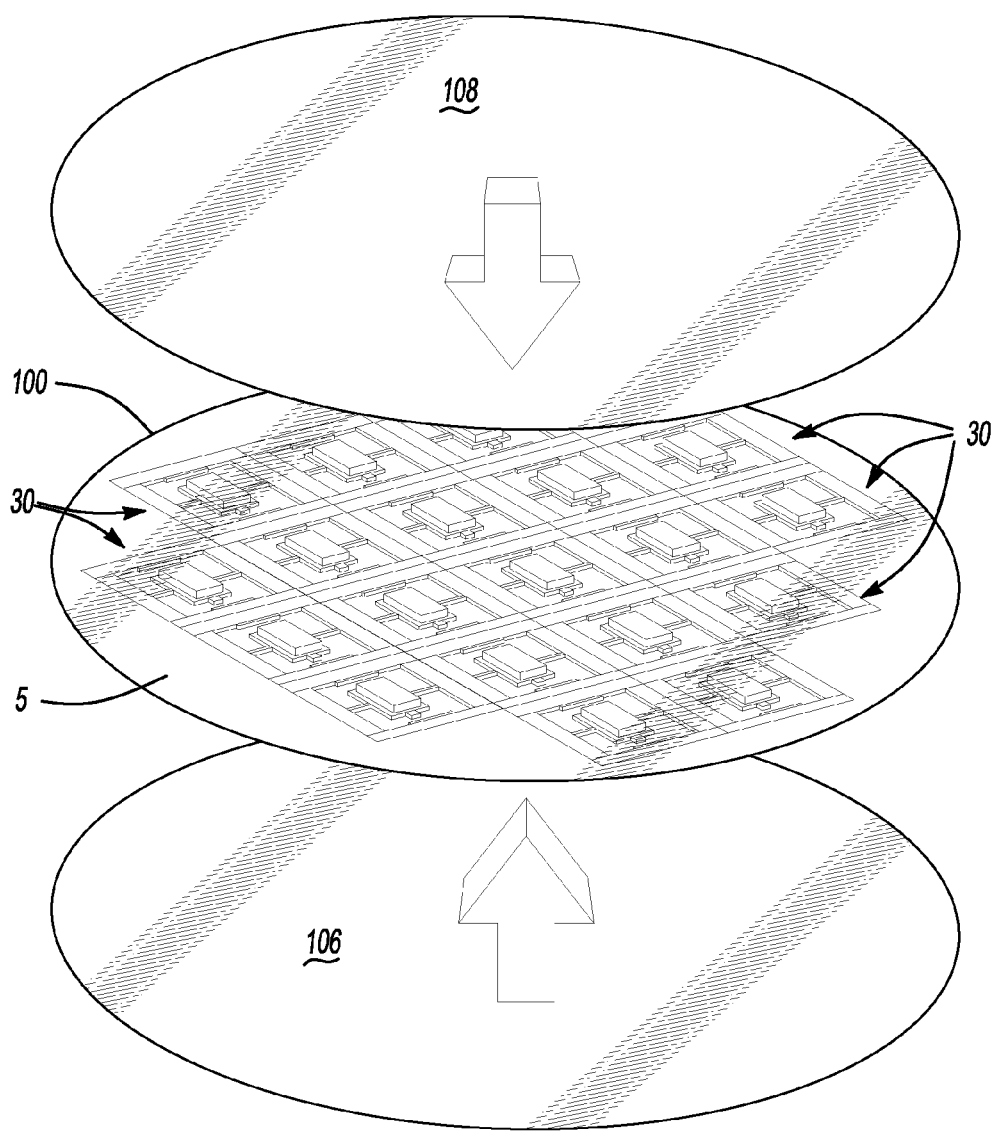
FIG. 19 is a perspective view of a plurality of energy harvesting devices made from a single wafer.

As illustrated in FIG. 19, a plurality of energy harvesting devices 30 can be made from a single wafer 5 with the lower cover 106 and the upper cover 108 provided by the placement and/or attachment of additional silicon wafers that may or may not have energy harvesting devices incorporated therewithin. In this manner, the fabrication of a plurality of energy harvesting devices is suited to conventional microfabrication techniques that enable mass production and cost reduction. In addition, a wide selection of energy harvesting device designs and fabrication methods can be used to accommodate various applications and maximize reliability and yield thereof.

Although a material of construction has been identified to be silicon and silicon alloys, other materials known to those skilled in the art can be used. For example and for illustrative purposes only, other electronic materials that lend themselves to conventional microfabrication techniques can be used for the base, low frequency element and piezoelectric element, and piezoelectric materials such as lead zirconate titanate (PZT), polyvinylidene (PVDF), lead titanate (PT), PZN-PT, zinc oxide (ZnO), and the like can be used for the piezoelectric strips and/or films. The conductive leads can be made from aluminum, gold, silver, alloys thereof, and the like. It is appreciated that the piezoelectric films and/or strips can be attached to the base, low frequency element and/or piezoelectric element using an method, technique, etc. know to those skilled in the art, illustratively including vapor deposition, deposition of a sol-gel solution, use of an adhesive and the like.

The invention is not restricted to the illustrative examples and embodiments described above. The embodiments are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

We claim:

1. An energy harvesting device comprising:
   a base;
   a low frequency element movably attached to said base, said low frequency element having three-dimensional vibrational movement;
   a first piezoelectric element attached to said base, said first piezoelectric element spaced apart from said low frequency element with vacant space therebetween;
   said base, low frequency element and first piezoelectric element generally defining a first plane;
   a second piezoelectric element attached to said base, said second piezoelectric element generally defining a second plane that is generally parallel to and spaced apart from said first plane;
   wherein said low frequency element impacts said first piezoelectric element or said second piezoelectric element when said low frequency element vibrates;
   impact of said piezoelectric element by said low frequency element elastically deforms said piezoelectric element; and
   said piezoelectric element generates a voltage differential in response to elastically deforming.

2. The energy harvesting device of claim 1, further comprising electrically conducting leads in electrical contact with said piezoelectric element and extending therefrom.

3. The energy harvesting device of claim 1, wherein said base is a frame, said frame surrounding said low frequency element.

4. The energy harvesting device of claim 1, wherein said base and said low frequency element is made from a material selected from the group consisting of silicon and a silicon alloy.

5. The energy harvesting device of claim 4, wherein said low frequency element is integral with said base.

6. The energy harvesting device of claim 1, further comprising an optional mass rigidly attached to said low frequency element.

7. The energy harvesting device of claim 6, wherein said optional mass is made from a metallic material.

8. The energy harvesting device of claim 7, wherein said metallic material is selected from the group consisting of tungsten, rhenium, gold, lead, and alloys thereof.

9. The energy harvesting device of claim 3, wherein said first piezoelectric element is a piezoelectric strip rigidly attached to said frame.

10. The energy harvesting device of claim 3, wherein said first piezoelectric element is a pair of piezoelectric strips rigidly attached to said frame with one piezoelectric strip rigidly attached to said frame on one side of said low frequency element and one piezoelectric strip rigidly attached to said frame on an oppositely disposed side of said low frequency element.

11. The energy harvesting device of claim 1, wherein said first piezoelectric element is a high frequency beam attached to said base, said high frequency beam having a resonant frequency and vibrating at said resonant frequency after impact by said low frequency element.

12. The energy harvesting device of claim 11, wherein said high frequency beam has a first end attached to said base and a second non-attached end spaced apart from said first end.

13. The energy harvesting device of claim 11, wherein said high frequency beam has a first end attached to said base and a second end attached to said base, said second end spaced apart from said first end.

14. The energy harvesting device of claim 11, wherein said high frequency beam has a beam element and a piezoelectric strip, said piezoelectric strip rigidly attached to said beam element.

15. The energy harvesting device of claim 14, wherein said piezoelectric strip is rigidly attached to said beam element proximate said first end.

16. The energy harvesting device of claim 14, wherein said high frequency beam has two piezoelectric strips with a first piezoelectric strip rigidly attached to a first side of said beam element and a second piezoelectric strip rigidly attached to an oppositely disposed second side of said beam element, said first and second piezoelectric strips rigidly attached proximate said first end of said beam element.

17. The energy harvesting device of claim 11, wherein said high frequency beam is a pair of spaced apart high frequency beams with a first high frequency beam located on one side of said low frequency element and a second high frequency beam located on an opposing side of said low frequency element.

18. The energy harvesting device of claim 1, wherein said second piezoelectric element is a piezoelectric strip located on said second plane.

19. The energy harvesting device of claim 1, further comprising a surrounding package enclosing said low frequency element and said piezoelectric element.

20. The energy harvesting device of claim 19, wherein said surrounding package is made from silicon.

* * * * *